(12) United States Patent
Malek et al.

(10) Patent No.: US 9,082,979 B2
(45) Date of Patent: Jul. 14, 2015

(54) PROCESS FOR PRODUCING AN ACTUATOR HAVING A STACK OF ALTERNATING INTERMEDIATE ELECTRODE LAYERS AND PIEZOELECTRIC MATERIAL LAYERS

(75) Inventors: Nadim Malek, Versailles (FR); Laurent Levin, Paris (FR)

(73) Assignee: RENAULT S.A.S., Boulogne-Billancourt (FR)

( * ) Notice: Subject to any disclaimer, the term of this patent is extended or adjusted under 35 U.S.C. 154(b) by 304 days.

(21) Appl. No.: 13/637,787

(22) PCT Filed: May 5, 2011

(86) PCT No.: PCT/FR2011/051019
§ 371 (c)(1),
(2), (4) Date: Dec. 5, 2012

(87) PCT Pub. No.: WO2011/138562
PCT Pub. Date: Nov. 10, 2011

(65) Prior Publication Data
US 2013/0074300 A1    Mar. 28, 2013

(30) Foreign Application Priority Data

May 6, 2010 (FR) ..................... 10 53545

(51) Int. Cl.
| | |
|---|---|
| *H04R 17/00* | (2006.01) |
| *H01L 41/277* | (2013.01) |
| *F02M 51/06* | (2006.01) |
| *F02M 69/04* | (2006.01) |

(Continued)

(52) U.S. Cl.
CPC ......... *H01L 41/277* (2013.01); *F02M 51/0603* (2013.01); *F02M 69/041* (2013.01); *H01L 41/293* (2013.01); *F02M 61/08* (2013.01); *H01L 41/0472* (2013.01); *Y10T 29/42* (2015.01)

(58) Field of Classification Search
USPC .......... 29/25.35, 592.1, 595, 602.1, 841, 855, 29/858, 883; 310/311, 328, 366, 369
See application file for complete search history.

(56) References Cited

U.S. PATENT DOCUMENTS

| | | | |
|---|---|---|---|
| 5,381,385 A | 1/1995 | Greenstein | |
| 6,661,158 B2 * | 12/2003 | Kawazoe | ...................... 310/328 |

(Continued)

FOREIGN PATENT DOCUMENTS

| | | | |
|---|---|---|---|
| CN | 101582484 A | * | 11/2009 |
| DE | 196 26 671 | | 10/1997 |

(Continued)

OTHER PUBLICATIONS

International Search Report Issued Jul. 20, 2011 in PCT/FR11/051019 Filed May 5, 2011.

*Primary Examiner* — Paul D Kim
(74) *Attorney, Agent, or Firm* — Oblon, McClelland, Maier & Neustadt, L.L.P.

(57) ABSTRACT

A process for producing an actuator configured to generate powerful ultrasonic waves and that includes a stack of alternating intermediate electrode layers and piezoelectric material layers. The method includes: forming an initial stack of alternating intermediate electrode layers and piezoelectric material layers, each end of the stack being a piezoelectric material layer or an intermediate electrode layer; firmly attaching adjacent layers to one another; cutting the initial stack into elementary blocks; and connecting the intermediate electrode layers together, in each elementary block.

11 Claims, 5 Drawing Sheets

(51) Int. Cl.
*H01L 41/293* (2013.01)
*F02M 61/08* (2006.01)
*H01L 41/047* (2006.01)

(56) References Cited

U.S. PATENT DOCUMENTS 7,439,655 B2 * 10/2008 Asano et al. ............ 310/328
7,825,566 B2 * 11/2010 Matsuo .................. 310/323.01
8,339,018 B2 * 12/2012 Inagaki et al. .......... 310/366
8,757,130 B2 * 6/2014 Kawamoto ............. 123/445

2004/0251784 A1   12/2004   Kuniyasu
2005/0099097 A1   5/2005    Baumgartner et al.
2010/0295420 A1   11/2010   Wierach

FOREIGN PATENT DOCUMENTS

| | | |
|---|---|---|
| EP | 1 172 552 | 1/2002 |
| FR | 2 862 161 | 5/2005 |
| JP | 03054878 A * | 3/1991 |
| JP | 08275564 A * | 10/1996 |
| WO | 2008 025315 | 3/2008 |

* cited by examiner

PROCESS FOR PRODUCING AN ACTUATOR HAVING A STACK OF ALTERNATING INTERMEDIATE ELECTRODE LAYERS AND PIEZOELECTRIC MATERIAL LAYERS

BACKGROUND

The subject of the present invention is a process for manufacturing an actuator based on piezoelectric materials, and more particularly an actuator comprising at least one stack of electrode layers and piezoelectric material layers. This actuator may be used in a fluid injector, such as a fuel injector, in the automotive industry.

Fuel injectors are used to produce very fine sprays of fuel in order to improve combustion and reduce pollution emissions. Piezoelectric ultrasonic fluid injectors allow the penetration of fuel into the combustion chamber to be controlled, thus enabling operation with a lean or stratified mixture.

Piezoelectric or magnetostrictive ultrasonic fluid injectors may be used to inject:
- diesel or any other fuel in direct injection or prechamber diesel engines;
- petrol or any other fuel in what are called direct or indirect injection petrol engines;
- any other fuel in an internal combustion engine, or a gas turbine, etc; and
- any fluid for regenerating depollution systems, such as for example nitrous oxide traps, or particulate traps, commonly referred to as particulate filters (PFs).

Figure 1:
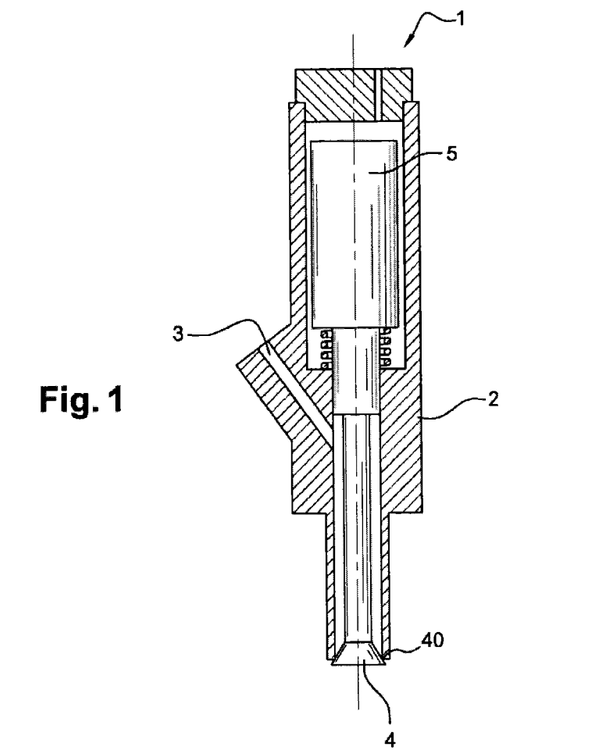
FIG. 1, described above, illustrates a fuel injector.

Ultrasonic injectors produce a fluid spray by breaking up a fluid. Such an injector 1 is illustrated in FIG. 1. The injector 1 comprises an injector body 2 and a fluid entrance 3 through which the fluid enters at a high pressure. The injector 1 makes the fluid pass through an oscillating mechanical device that is an orifice obtained by separating the head 4 of a needle valve from its seat 40. This orifice opens and closes at an ultrasonic frequency. The source of the mechanical excitation is a stack 5 of piezoelectric ceramics or a bar of magnetostrictive material or a material having similar properties. These electroactive materials are supplied with power by suitable power supplies.

The rest of the description is devoted to the active array, i.e. the actuator, comprising the stack of piezoelectric material layers. This active array can be used both in a closed nozzle injector and in an open nozzle injector.

Piezoelectric ceramic stacks conventionally take two forms.

On the one hand, stacks of thick ceramic layers that have a 1 to 5 mm unitary thickness are known in the form of rings or drilled disks allowing a preload screw to pass axially through the stack, which stack also comprises intermediate electrodes made of a metal alloy a few tens or hundred of microns in thickness. This type of assembly gives rise to technical and economic problems in industrial production.

This is because, to be obtain perfect reproducibility, this type of fitting requires additional machining related to the drilling of the parts allowing insertion of the preload screw. This type of fitting also requires each face of each ceramic and each intermediate electrode layer to have submicron flatness, meaning that both faces of each part must be carefully polished before said part is fitted in the stack.

On the other hand, stacks of ceramic layers having a small unitary thickness, typically of about 100 μm (micrometers or microns), and comprising intermediate electrodes a few microns, for example about 5 μm, in thickness, are known, the intermediate electrodes being deposited on the ceramics. In this case, the intermediate electrodes are connected to connection electrodes, for example using a polymer filled with a conductive material, and the area of contact locally makes contact with an intermediate electrode over a height of a few microns, for example 5 μm. This type of assembly causes problems on the one hand because it is difficult to produce the connection, and on the other hand because this connection is mechanically fragile in the contact zone, which does not exceed 5 μm. This assembly is therefore not suitable for generating power ultrasound and does not adequately withstand the presence of liquid or gaseous hydrocarbons because the conductive polymer reacts with the fuel.

Power ultrasound is generated by high-amplitude (approximately about 5 to 10 μm), high-load (approximately about 40 MPa) oscillating movements at ultrasonic frequencies (typically between 10 kHz and 100 kHz). A problem associated with power ultrasound is that it may generate substantial shear stresses at the joint where the intermediate electrode makes contact with the connection electrode.

BRIEF SUMMARY

The object of the invention is to overcome these drawbacks.

The invention in particular provides a process that allows an actuator comprising a stack of thick electrode and piezoelectric material layers to be manufactured simply and economically and with a high degree of precision.

The subject of the invention is thus a process for manufacturing an actuator suited to generating power ultrasound and comprising a stack of alternate intermediate electrode and piezoelectric material layers.

The process according to the invention comprises the following steps:
- a step of forming an initial stack of alternate intermediate electrode and piezoelectric material layers, each end of the stack being a piezoelectric material or intermediate electrode layer;
- a step of securely joining adjacent layers together;
- a step of cutting the initial stack into elementary units; and
- a step of connecting the intermediate electrode layers of each elementary unit together.

The step of securely joining adjacent layers together is advantageously a step of adhesive bonding or soldering.

The process may comprise a step of welding connection electrodes to corresponding visible faces of the intermediate electrode layers. The intermediate electrode layers may be a few hundred microns in thickness. The intermediate electrode layers may thus be between 100 μm and 1 mm in thickness.

The intermediate electrode layers may be connected together using connection electrodes comprising notches intended to receive the intermediate electrode layers of the elementary units, and the connection electrodes may be positioned at least in part in indents in the piezoelectric material layers of the initial stack.

The indents in the piezoelectric material layers of the initial stack may be obtained by cutting the piezoelectric material layers through perforations produced in the piezoelectric material layers.

The perforations in the piezoelectric material layers of the initial stack are preferably circular.

The perforations may be obtained by drilling.

The piezoelectric material layers of the initial stack advantageously have two opposite ends provided with indents and the intermediate electrode layers of the initial stack may have a single end provided with indents.

The respective ends, provided with indents, of two successive intermediate electrode layers of the initial stack, advantageously lie opposite each other.

BRIEF DESCRIPTION OF THE DRAWINGS

Other features and advantages of the present invention will become more clearly apparent on reading the following description given by way of exemplary and nonlimiting illustration and with reference to the appended drawings, in which.

DETAILED DESCRIPTION

At the start of the process, the piezoelectric ceramics and the intermediate electrodes should be assembled in advance, care being taken to correctly align the stack of ceramics and electrodes. This results in an integral multilayer stack of thick ceramics (a few millimeters in thickness) and intermediate electrodes (a few hundred microns in thickness). The ceramics must be stacked in alternation with the intermediate electrodes in order for it to be possible to excite them using an electric field applied through each of the ceramic layers. The electric field results from applying a voltage to the terminals of two intermediate electrodes located on two opposite faces of said ceramic layer.

Figure 2A:
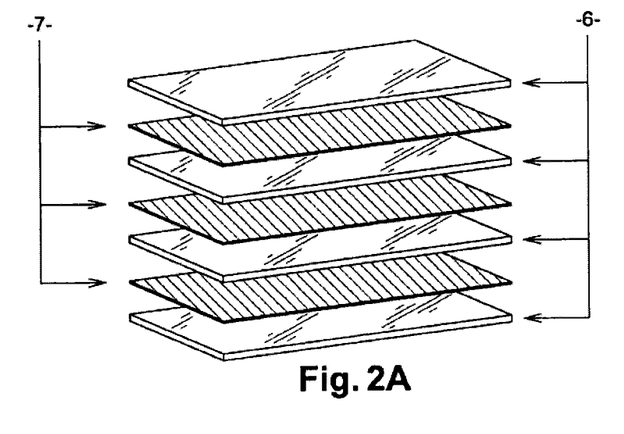
FIGS. 2A to 2G illustrate various steps of a process for manufacturing an actuator according to the invention, in a first embodiment.

As illustrated in FIG. 2A, the process starts with the stacking of large piezoelectric ceramic sheets 6 and large intermediate electrode foils 7.

The piezoelectric ceramic sheets 6 may typically have dimensions of 150 mm×100 mm and be 1 mm to 5 mm in thickness.

The intermediate electrodes 7 may be metal foils having dimensions of 150 mm×100 mm and preferably being between 100 µm and 1 mm in thickness. They are typically made of a copper, titanium or silver alloy.

The metal chosen depends on the parameters to be optimized, such as for example: acoustic transmission; stress reduction at the soldering or adhesive interfaces; and the ease of connection of the intermediate and connection electrodes.

Figure 2B:
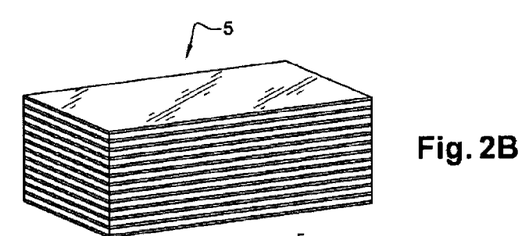

In a second step, such as illustrated in FIG. 2B, the stack 5 is soldered or adhesively bonded so as to obtain a parallelepiped 5.

The six planes of the parallelepiped 5 may be adjusted so as to obtain an almost perfect geometric shape. The dimensions of this parallelepiped 5 may typically be 150 mm×100 mm with a height of 40 mm.

The size and shape of the parallelepiped 5 and the piezoelectric ceramic sheets 6 and the intermediate electrode foils 7 have been given by way of example and are nonlimiting. For example sheets and foils having a cross-sectional area of 100 mm×100 mm may be used.

The soldering or adhesive bonding is a joining process that also acts as a filler, correcting flatness defects and thus avoiding the need for ultrafine polishing of both faces of the piezoelectric ceramic sheets 6 and intermediate electrode foils 7. Another advantage of securely joining the sheets and foils is that it is not necessary to use clamping means during subsequent handling firstly of the parallelepiped 5, and then, later on, of the elementary units 5A.

Figure 2C:
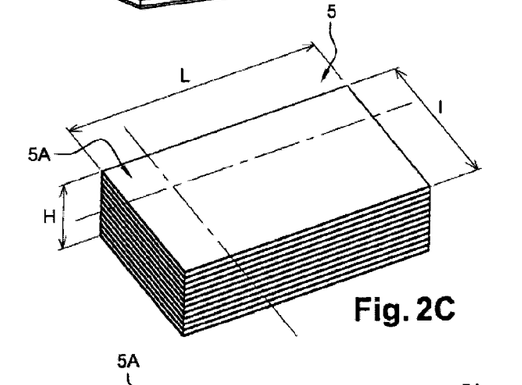

Next, the parallelepiped 5 is cut to obtain elementary units 5A. These elementary units 5A preferably are of a size suitable for producing an actuator able to generate power ultrasound for an ultrasonic injector such as described above, i.e. about 15 mm×15 mm×40 mm (FIG. 2C). In another nonlimiting example, the dimensions may be 20 mm×20 mm×40 mm.

Figure 2D:
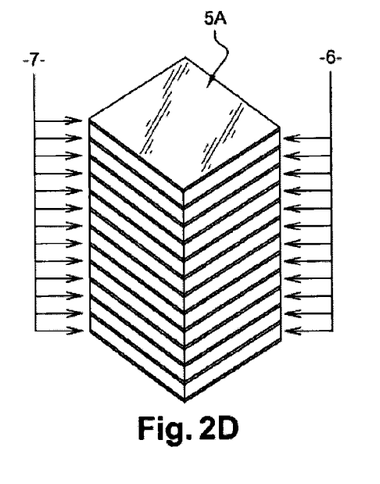

FIG. 2D shows an elementary stack 5A with a square cross section, for example 15 mm by 15 mm in area, resulting from cutting of the soldered or adhesively bonded parallelepiped 5.

In order to interconnect the intermediate electrodes 7 so as to obtain the electric field in each of the piezoelectric ceramic layers 6, and to reverse the movement induced in phase in each of the ceramic layers 6, it is necessary to use connection electrodes 8.

Figure 2E:
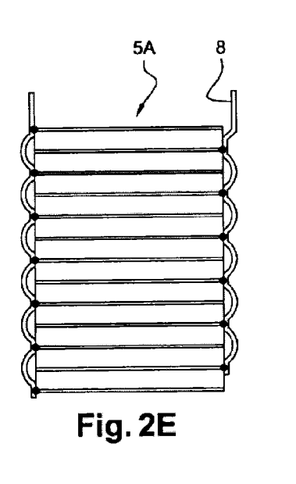
Figure 2F:
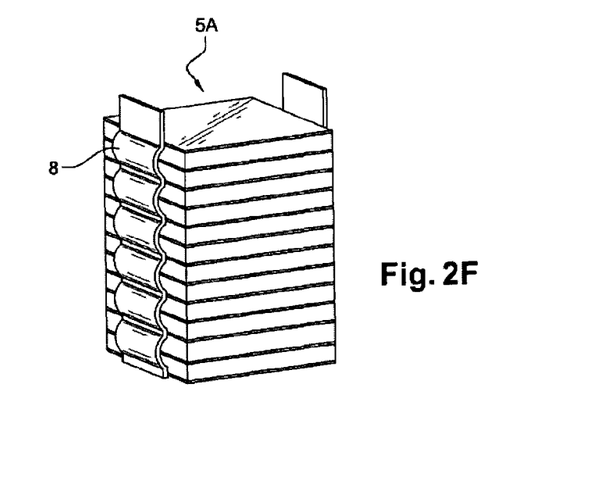
Figure 2G:
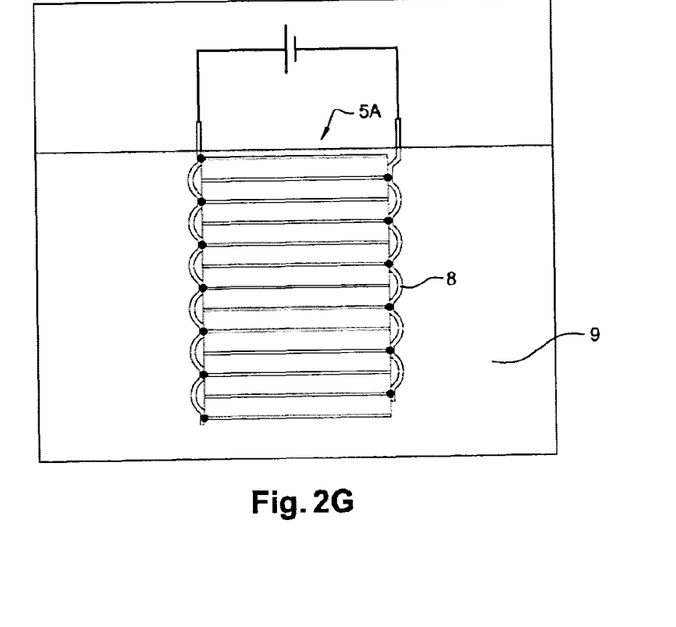

A first embodiment is illustrated in FIGS. 2E, 2F and 2G.

According to this first embodiment, the connection electrodes 8 are corrugated and comprise flat regions that make contact with the intermediate electrodes 7. The connection electrodes 8 are welded to the intermediate electrodes 7, for example using a laser beam. The intermediate electrodes 7 and the connection electrodes 8 make contact on the visible faces of the intermediate electrodes 7. The contact and the laser welding are possible because an intermediate electrode 7 that is a few hundred microns in thickness, preferably between 100 µm and 1 mm in thickness, is used. This thickness is to be compared to the thicknesses of the very thin intermediate electrodes, which are a few microns thick, employed in multilayer stacks, and which are connected to the connection electrodes using a conductive adhesive. Specifically, welding, for example spot welding, the intermediate electrodes 7 and connection electrodes 8 together provides a much stronger, especially with respect to shear stresses, joint that is suitable for power ultrasound. All or part of the contact area between the intermediate electrode 7 and the connection electrode 8 may be spot welded.

The complete, assembled stack is illustrated in FIG. 2F.

In the case where the assembly is achieved by soldering, the process may preferably end in a step of biasing the elementary stack 5A using techniques well known to those skilled in the art. This operation is carried out by applying an appropriate voltage and by immersing the stack in a dielectric oil 9 that is brought to a suitable temperature (FIG. 2G).

In this first embodiment, it may be seen that the intermediate electrodes 7 and the connection electrodes are connected via a flat region, and that the connection electrodes 8 have a shape suitably designed to keep them a sufficient distance away from oppositely biased intermediate electrodes 7, so as to prevent electric arcing and short-circuiting. In FIGS. 2E, 2F and 2G, this suitably designed shape comprises curved sections between two flat regions.

Figures 3A, 3B:
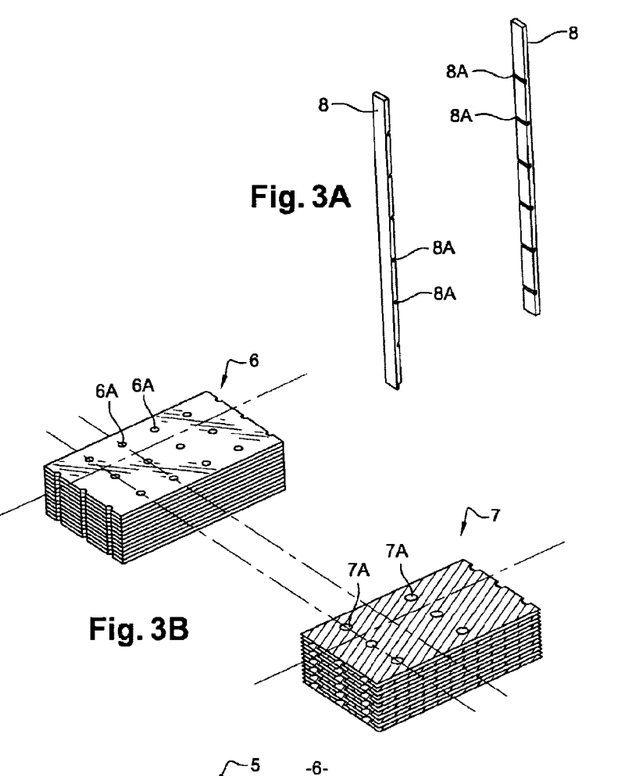
FIGS. 3A to 3F illustrate various steps of a process for manufacturing an actuator according to the invention, in a second embodiment.

A second embodiment is shown in FIGS. 3A to 3F. In this second embodiment, use of thick, rectilinear connection electrodes 8 that contain notches level with each intermediate electrode 7 may be envisioned, such as illustrated in FIG. 3A. This type of connection electrode 8 allows more compact elementary actuator units 5A to be obtained. The notches 8A make it possible to increase the area of contact between the connection electrodes 8 and the intermediate electrodes 7. The notches 8A are preferably grooves produced across the entire width of the connection electrode 8.

To connect a connection electrode 8 to the intermediate electrodes 7 via the notches 8, it is necessary to produce indents 6B in the faces of all the piezoelectric ceramic layers 6 that face the connection electrodes 8.

In order for there to be a sufficient distance between a connection electrode 8 and the oppositely biased intermediate electrodes 7, it is furthermore necessary to produce indents 7B in the faces of these intermediate electrodes 7 that face this connection electrode 8. In this way electric arcing or short-circuiting between the connection electrode 8 and the oppositely biased intermediate electrodes 7 is prevented.

The indents 6B and/or 7B may for example be approximately semicircular. These semicircles may result from the cutting of holes or perforations. In this embodiment, the process for manufacturing the actuator may then comprise a step of drilling the piezoelectric material sheets 6 and the intermediate electrode foils 7.

Figure 3C:
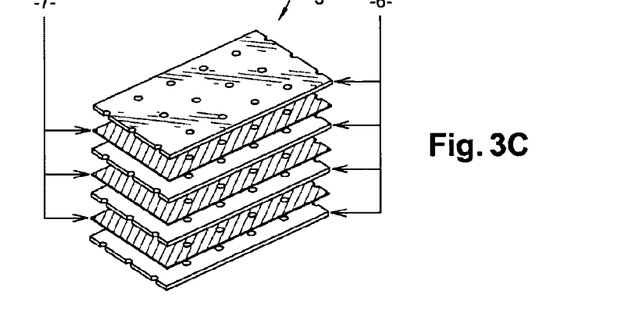
Figure 3D:
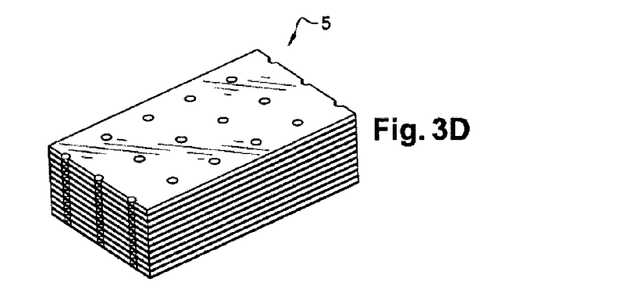

In accordance with FIGS. 3B, 3C and 3D, holes 6A are produced in the piezoelectric ceramic sheets 6. A series of holes 6A is produced across the width of the sheet 6. The centers of these holes 6A are spaced out with an interhole distance that is substantially equal to the width of the elementary units 5A obtained after the parallelepiped 5 has been cut. This series of holes 6A is then reproduced lengthwise along the sheet 6 with a spacing that is substantially equal to the length of the elementary units 5A obtained after cutting. The spacing is defined between the axes, of each series, passing through the center of the holes 6A.

The holes 7A are produced in the same way in the intermediate electrode foils 7 so as to form a series of holes across the width of the foil 7. This series of holes 7A is however reproduced with double the spacing lengthwise along the foil 7.

The example corresponds to the production of elementary units 5A having a square cross section. It goes without saying that this example is in no way limiting and that a person skilled in the art will be able to change the position of the holes depending on the cross section desired for the elementary units to be produced.

Holes 6A and 7A are produced in the ceramic sheets and in the intermediate electrode foils 7. These sheets 6 and these foils 7 are joined in alternation by soldering or by adhesive bonding and then the parallelepiped 5 is cut widthwise through the center of the holes 6A.

FIG. 3B illustrates the drilling of the piezoelectric ceramic sheets 6 and the intermediate electrodes 7. The ceramic sheets 6 thus contain holes 6A, whereas the intermediate electrodes 7 contain holes 7A. Thus, lengthwise along the sheets, the intermediate electrode foils 7 have two times fewer holes than the ceramic sheets 6. In addition, two successive intermediate electrode foils 7 are obtained by rotating one foil relative to the other by a half turn. This has the advantage that the manufactured intermediate electrode foils 7 are identical and alternatively rotated to produce the stack.

Figure 3E:
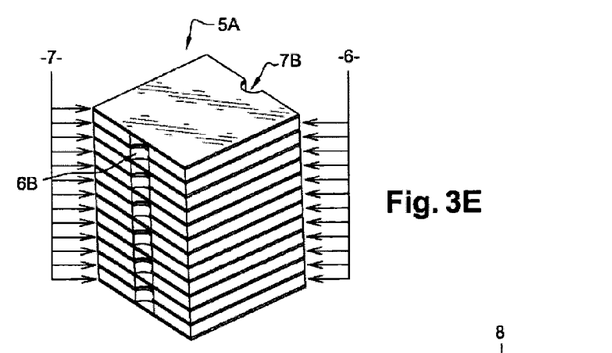

Next, the piezoelectric ceramic sheets 6 and the intermediate electrode foils 7 are alternated so as to form the stack 5 (FIG. 3C). After soldering or adhesive bonding, a parallelepiped 5 is obtained (FIG. 3D) that is cut into elementary stacks 5A (FIG. 3E). The cutting is carried out along axes passing widthwise through the centers of the holes 6A of the ceramic sheets 6, and cutting is carried out lengthwise along axes passing in between the rows of holes 6A.

Figure 3F:
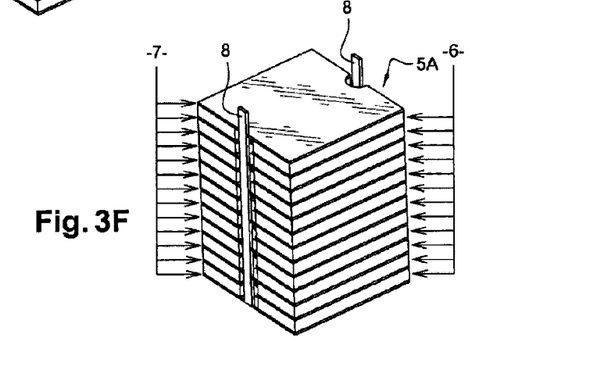

Next, the notches 8A of the notched connection electrodes 8 are positioned level with the intermediate electrodes 7 and the area of contact between the notches 8A and the intermediate electrodes 7 is welded, for example using a laser beam. Thus a connected integral elementary stack 5A, such as illustrated in FIG. 3F, is obtained. The welding is not limited to laser welding and any suitable welding method known to those skilled in the art may be used.

The latter operation may consist in biasing the stack using techniques known to those skilled in the art, especially in the case where the secure joining is obtained by soldering.

This operation is carried out by applying an appropriate voltage and by immersing the stack in a dielectric oil brought to a suitable temperature as described above.

It is possible that an elementary unit 5A with a square cross section will be unsuitable, a circular cross section being required. In this variant, specific to the second embodiment, starting with the indent-containing elementary unit 5A, and before the connection electrodes have been welded, all that is required is to turn the unit 5A having a square cross section on a machine tool so as to convert it into an integral unit having a circular cross section. The notches of the connection electrodes may be of any shape suitable for these disk-shaped intermediate electrodes.

In this case, the indents advantageously permit the intermediate electrodes to be brought into contact with the connection electrodes. The quality of the contacts is then identical to that obtained with an integral elementary unit of square cross section.

The invention claimed is:

1. A process for manufacturing an actuator configured to generate power ultrasound and including a stack of alternate intermediate electrode and piezoelectric material layers, the method comprising:
   forming an initial stack of alternate intermediate electrode and piezoelectric material layers, each end of the stack being a piezoelectric material layer or an intermediate electrode layer;
   securely joining adjacent layers together;
   cutting the initial stack into elementary units such that, in a first elementary unit of the elementary units, each of the intermediate electrode layers has a first visible face on a first side of the first elementary unit and a second visible face on a second side of the first elementary unit; and
   connecting the intermediate electrode layers, including a first group and a second group, of the first elementary unit together via a first connection electrode and a second connection electrode,
   wherein the first connection electrode connects the first visible face of each of the first group of the intermediate electrode layers without contacting the first visible face of each of the second group of the intermediate electrode layers.

2. The process as claimed in claim 1, wherein the securely joining adjacent layers together includes adhesive bonding or soldering.

3. The process as claimed in claim 1, further comprising welding the first connection electrode to the first visible face of each of the first group of the intermediate electrode layers.

4. The process as claimed in claim 3, wherein the intermediate electrode layers are between 100 µm and 1 mm in thickness.

5. The process as claimed in claim 1, wherein the second connection electrode connects the second visible face of each of the second group of the intermediate electrode layers without contacting the second visible face of each of the first group of the intermediate electrode layers.

6. The process as claimed in claim 1, wherein the first connection electrode has a shape including flat regions to contact the first face of each of the first group of the intermediate electrode layers and curved sections between the flat regions to avoid contact with the first face of each of the second group of the intermediate electrode layers.

7. A process for manufacturing an actuator configured to generate power ultrasound and including a stack of alternate intermediate electrode and piezoelectric material layers, the method comprising:

forming an initial stack of alternate intermediate electrode and piezoelectric material layers, each end of the stack being a piezoelectric material layer or an intermediate electrode layer;

securely joining adjacent layers together;

cutting the initial stack into elementary units; and connecting the intermediate electrode layers of each elementary unit together, wherein the connecting the intermediate electrode layers includes attaching connection electrodes to the intermediate electrode layers, the connection electrodes comprising notches configured to receive the intermediate electrode layers of the elementary units, and the connection electrodes are positioned at least in part in indents in the piezoelectric material layers of the initial stack.

8. The process as claimed in claim 7, wherein the indents in the piezoelectric material layers of the initial stack are obtained by cutting the piezoelectric material layers through perforations produced in the piezoelectric material layers.

9. The process as claimed in claim 8, wherein the perforations in the piezoelectric material layers of the initial stack are circular.

10. The process as claimed in claim 9, wherein the perforations are obtained by drilling.

11. The process as claimed in claim 7, wherein the piezoelectric material layers of the initial stack have two opposite ends including the indents and the intermediate electrode layers of the initial stack have a single end including the indents.

\* \* \* \* \*